United States Patent [19]

Hang et al.

[11] Patent Number: 4,997,795
[45] Date of Patent: Mar. 5, 1991

[54] DIELECTRIC COMPOSITIONS OF DEVITRIFIED GLASS CONTAINING SMALL AMOUNTS OF LEAD OXIDE AND IRON OXIDE

[75] Inventors: Kenneth W. Hang, Westchester, Pa.; Ashok N. Prabhu, East Windsor; Wayne M. Anderson, Trenton, both of N.J.

[73] Assignee: General Electric Company, Schenectady, N.Y.

[21] Appl. No.: 447,273

[22] Filed: Dec. 7, 1989

Related U.S. Application Data

[60] Continuation-in-part of Ser. No. 315,636, Feb. 27, 1989, abandoned, which is a division of Ser. No. 87,589, Aug. 20, 1987, Pat. No. 4,808,673, which is a continuation-in-part of Ser. No. 914,302, Oct. 2, 1986, abandoned.

[51] Int. Cl.$^5$ .......................... C03C 8/04; C03C 8/10
[52] U.S. Cl. ........................................ 501/24; 501/17; 501/22; 501/26; 501/8; 501/9; 106/1.13; 428/210; 428/432; 428/901
[58] Field of Search .................. 501/17, 22, 24, 26, 501/21, 8, 9, 20; 106/1.05, 1.13, 1.14; 428/210, 426, 432, 901

[56] References Cited

U.S. PATENT DOCUMENTS

| 3,527,649 | 9/1970 | Sullivan | 501/26 |
| 4,102,692 | 7/1978 | Schartau et al. | 501/73 |
| 4,624,934 | 11/1986 | Kokubu et al. | 501/17 |
| 4,699,827 | 10/1987 | Baudry | 501/17 |
| 4,772,574 | 9/1988 | Hang et al. | 501/21 |
| 4,808,673 | 2/1989 | Hang et al. | 427/126.3 |
| 4,830,988 | 5/1989 | Hang et al. | 501/21 |

FOREIGN PATENT DOCUMENTS

| 0148012 | 11/1979 | Japan | 501/22 |
| 0088039 | 6/1982 | Japan | 501/26 |
| 0460261 | 2/1975 | U.S.S.R. | 501/26 |

Primary Examiner—Mark L. Bell
Assistant Examiner—Sue Hollenbeck
Attorney, Agent, or Firm—James Magee, Jr.; James C. Davis, Jr.

[57] ABSTRACT

An improved dielectric formulation for the fabrication of multilayer, integrated circuits which comprises a devitrifying zinc-magnesium-barium-aluminum-zirconium-phosphosilicate glass frit, a devitrifying zinc-magnesium-barium-aluminum-silicate glass frit, or a devitrifying zinc-magnesium-strontium-aluminum-silicate glass frit which are stabilized by the presence of from about 0.01 to about 1 weight percent each of lead oxide and iron oxide.

17 Claims, No Drawings

DIELECTRIC COMPOSITIONS OF DEVITRIFIED GLASS CONTAINING SMALL AMOUNTS OF LEAD OXIDE AND IRON OXIDE

This application is a continuation-in-part of U.S. Pat. Application, Serial No. 315,636 filed Feb. 27, 1989, which is a division of Serial No. 087,584, filed Aug. 20, 1987 now U.S. Pat. No. 4,808,673 which in turn is a continuation- in-part of Serial No. 914,302, filed Oct. 2, 1986, now abandoned.

This invention relates to dielectric materials and their use in fabricating multilayer electrical circuit structures, and more particularly to glass frit compositions for dielectric inks and tapes.

BACKGROUND OF THE INVENTION

The use of specialized ink formulations to form thick films having various functions on suitable substrates in the construction of multilayer integrated circuits is known in the art. Such technology is of increasing interest in the fabrication of very dense multilayer circuit patterns on various substrates for a wide variety of applications in the electronics industry.

Thick-film multilayer structures typically are comprised of at least two patterned layers of a conductor separated by a dielectric layer. The patterned conductor layers are connected by a metallic conductor deposited in vias in the dielectric layer. Such structures are formed by multiple deposition and firing of layers of conductor and dielectric inks.

Such multilayer circuit structures utilizing copper as the conductor metal have a number of problems. The most common is failure caused by the development of electrical shorts due to interactions between certain materials of the copper containing conductive ink and the dielectric layer which take place during the multiple firings involved in fabricating multilayer integrated circuits. If the dielectric material is not resistant to the penetration of flux components, conductive channels can form in the dielectric layer. When such a channel passes completely through a dielectric layer and makes contact between an overlying copper conductor, an electrical short results.

A second problem common to certain multilayer circuits is porosity in the fired dielectric layer resulting from the evolution of gases produced by decomposition of organic vehicle materials and oxides of bismuth and copper during firing. Contaminant materials, e.g. molten eutectic phases from fired copper conductor layers, can readily leach into the porous passages. The integrity of the dielectric layers in a multilayer structure is also important because the voids therein lower the resistance of the dielectric, which is undesirable.

It is conventional to print and fire at least two layers of dielectric ink between conductors to minimize the possibility that evolving gases will form connected passages through the dielectric. It is possible to reduce the tendency of contaminant materials to leach into a dielectric material by formulating the ink with a higher quantity of glass frit thereby decreasing the porosity of the fired material. However, both this solution and the multiple print and fire approach can result in the trapping of gases within the dielectric layer. This will cause both the dielectric layer and overlying conductor layers to blister and peel during subsequent nitrogen firings.

Typically, the glass phase of a glass-filed dielectric will flow and densify at between 500°-650° C. Ideally, all traces of the organic vehicle in the ink should be removed before the glass flows and densifies. Conventionally, this is not readily achieved without the addition of oxidizer constituents such as barium nitrate. While such additives are effective in removing trace amounts of carbonaceous material, they are known to evolve gas, particularly oxygen, during subsequent firings. These gases can cause blistering and peeling of subsequently applied layers and can substantially increase the porosity of overlying dielectric layers. In addition, the gases evolved from these materials can react with copper from adjacent copper conductors and via fills to form copper oxide, which, in turn, can react with flux materials and form an eutectic phase which will readily penetrate porous dielectric material.

Another approach to ensure removal of carbonaceous residues from a dielectric material is to treat the dried ink, before firing, with an oxidizing or reducing plasma as disclosed by Prabhu et al. in U.S. Pat. No. 4,619,836, issued Oct. 28, 1986. This treatment, while a significant improvement, does introduce an additional processing step and additional apparatus requirements into the manufacture of copper-based multilayer circuitry.

In addition to the requirements noted above, the dielectric layer must be resistant to the formation of microcracks resulting from thermal cycling and have a coefficient of thermal expansion which matches that of the substrate, which is generally alumina.

In accordance with this invention, there are provided novel dielectric glass compositions which form dielectric layers having reduced porosity without oxidizers, such as barium nitrate, or a plasma treatment prior to firing.

SUMMARY OF THE INVENTION

The above-described objectives, particularly control of thermal expansion and stabilization against microcracking are achieved by formulating the dielectric materials, e.g., inks and tape slurry, with iron oxide and lead oxide-containing devitrifying glass compositions. The presence of lead oxide and iron oxide has been found to provide unexpected control over the coefficient of thermal expansion and the thermal stability of the dielectric material during fabrication and use of electronic structures.

This invention encompasses the iron-oxide and lead oxide-containing glass compositions, per se, as well as dielectric formulations such as inks, tapes, and slurries which contain the glass composition in combination with vehicles, binders, plasticizers, solvents, and the like conventionally employed to prepare and manipulate such formulations.

In broad terms the iron oxide and lead oxidecontaining devitrifying glass compositions can be described as zinc-magnesium-aluminum silicate glasses which, in addition, contain barium or strontium.

Inks falling within the scope of the invention are generally formulated to include an organic vehicle and up to about 30 weight percent of a ceramic filler.

The dielectric compositions of this invention are useful, for example, in the fabrication of multilayer integrated circuit structures. While the subject inks can be utilized in the fabrication of multilayer structures incorporating other metallic conductors such as silver, they are particularly suited to structures based on copper conductors and will be so described herein. The devitrifying glass compositions can be utilized to form standalone substrates for a wide variety of electronic applications.

The ink compositions of this invention contain from about 50 to about 75 percent by weight of the glass frit, from about 15 to about 30 percent by weight of a suitable organic vehicle and up to about 30 percent by weight of a suitable ceramic filler. More preferred ink compositions contain from about 60 to 70 percent by weight of the glass frit, from about 20 to about 25 percent by weight of the organic vehicle and from about 5 to 15 percent by weight of the filler. In some applications, particularly when the devitrifying zinc-magnesium-barium-aluminum-silicate glass frit is used with an alumina substrate, the preferred ink compositions contain from about 60 to about 75 percent by weight of the glass frit, from about 20 to about 25 percent by weight of the organic vehicle and from about 1 to about 10 percent of the filler.

The dielectric tapes of this invention are generally prepared by conventional techniques from a slurry continuing from about 40 to about 80 weight percent glass and inorganic fillers, from about 20 to about 60 weight percent solvent, from about 1 to about 8 weight percent resin, from about 0.5 to about 4 weight percent plasticizer, and 0.05 to about 2 weight percent surfactant.

Illustrative solvents include xylene 4, ethanol, toluene, trichloroethylene, and the like.

Illustrative plasticizers include dioctylphthalate, butylbenzylphthalate, ethylhexylbenzylphthalate and the like.

Compatible resins and surfactants are well known, e.g., polyvinyl butyral and fish oil.

In another aspect, this invention can be described as a method for stabilizing dielectric layers or films against thermal development of microcracks during fabrication and operation of integrated circuits.

DESCRIPTION OF THE INVENTION

The dielectric formulation of this invention is based on the discovery of the presence of small amounts of lead oxide and iron oxide in certain devitrifying glass compositions which provide thermal properties not attainable in the absence of these constituents.

In general, the amount of iron oxide and lead oxide ranges from about 0.01 to about 1 weight percent for each of these constituents, with preferred levels being from about 0.05 to about 0.8 and most preferred being from about 0.3 to about 0.7 weight percent.

The iron oxide and lead oxide can be incorporated into the glass composition by any convenient means, including addition of make-up amounts necessary to establish the necessary or preferred levels.

The devitrifying zinc-magnesium-barium-aluminum-zirconium-phosphosilicate glass compositions of this invention comprises, on a weight basis:
a) from about 15 to about 25 percent of zinc oxide (ZnO),
b) from about 10 to about 25 percent of magnesium oxide (MgO),
c) from about 3 to about 12 percent of barium oxide (Ba0),
d) from about 5 to about 20 percent of aluminum oxide ($Al_2O_3$),
e) from about 35 to about 50 percent of silicon dioxide ($SiO_2$),
f) from about 0.5 to about 3 percent of phosphorus pentoxide ($P_2O_5$),
g) from about 1 to about 5 percent of zirconium silicate ($ZrSiO_4$), and from about 0.01 to about 1 percent each of iron oxide and lead oxide,.

Preferred glass formulations in accordance with this invention contain, in addition to the iron and lead oxides, on a weight basis: from about 16 to about 22 percent of ZnO; from about 16 to about 22 percent of MgO; from about 5 to about 10 percent of BaO; from about 8 to about 11 percent of $Al_2Ohd 3$; from about 39 to 43 percent about 1 to about 2 percent of $P_2O_5$; and from about 2 to about 3 percent of $ZrSiO_4$. The devitrifying zinc-magnesium-barium-aluminum-silicate glass frit of this invention comprises, on a weight basis:
a) from about 15 to about 25 percent of zinc oxide (ZnO),
b) from about 10 to about 25 percent of magnesium oxide (MgO);
c) from about 3 to about 12 percent of barium oxide (BaO),
d) from about 5 to about 20 percent of aluminum oxide ($Al_2O_3$),
e) from about 35 to 50 percent of silicon dioxide ($SiO_2$),
f) from about 09 to about 3 percent of phosphorus pentoxide ($P_2O_5$),
g) from 0 to about 5 percent of zirconium silicate ($ZrSiO_4$), and from 0.01 to about 1 percent each iron oxide and lead oxide.

When the devitrifying zinc-magnesium-barium-aluminum-silicate glass frit of the present invention contains, on a weight basis, from 0 to about 0.5 percent of phosphorus pentoxide and from 0 to about 1 percent zirconium silicate, the crystallization rate is increased. This particular frit is useful when it is desirable to have a dielectric ink which is highly resistant to flow.

More preferred devitrifying glass compositions in accordance with this invention comprise, on a weight basis: from about 17 to about 23.5 percent ZnO; from about 17 to about 23.5 percent MgO; from about 5 to about 10 percent BaO; from about 8 to about 11 percent $Al_2O_3$; and from about a 39 to about 43 percent $SiO_2$.

The devitrifying zinc-magnesium-strontium-aluminum-silicate glass compositions comprises on a weight basis:
a) from about 15 to about 25 percent of zinc oxide (ZnO),
b) from about 10 to about 25 percent of magnesium oxide (MgO),
c) from about 3 to about 12 percent of strontium oxide (SrO),
d) from about 5 to about b 20 percent of aluminum oxide ($Al_2O_3$),
e) from about 35 to about 50 percent of silicon dioxide ($SiO_2$)
f) from 0 to about 3 phosphorus pentoxide ($P_2O_5$),
g) from 0 to about 5 zirconium silicate ($ZrSiO_4$), and about 0.01 to about 1 percent each iron oxide and lead oxide.

A preferred devitrifying zinc-magnesium-strontium-aluminum-silicate glass in accordance with this invention comprises, on a weight basis: from about 17 to about 23.5 percent ZnO; from about 17 to about 23.5 percent MgO; from about 3 to about 10 percent SrO; from about 7 to about 11 percent of $Al_2O_3$; from about 38 to about 43 percent of $SiO_2$; from 0 to about 2 percent of $P_2O_5$ and from 0 to about 2 percent of $ZrSiO_4$.

The glass compositions can be conventionally prepared by comminuting the various oxides, thoroughly mixing them in the appropriate proportion and melting the mixed oxides, e.g. in air at 1450°–1600°.

The stand-alone substrate suitable for integrated circuit fabrication comprises from about 6 to about 100 percent by weight of the devitrifying glass frits of the present invention and up to about 35 percent by weight of a suitable ceramic filler.

The stand-alone substrate or other suitable substrates, such as alumina, can be used in conjunction with the dielectric formulations of the present invention to produce a multilayer circuit structure, particularly an integrated circuit structure. The substrate for the circuit structure contains at least two patterned layers of a conductor, such as copper, which are separated by a dielectric layer made from the herein described formulations. The dielectric layer contains vias which can be filled with a conductor to contact the patterned conductor layers. The dielectric layer comprises from about 65 to 100 percent by weight of the devitrifying glass frits of the present invention and up to about 35 percent, preferably about 5 to about 26 percent, by weight of a suitable ceramic filler.

For most applications, the dielectric formulation may contain only the devitrifying glass frit and a suitable organic vehicle. However, for certain applications, such as the production of stand-alone substrates, or to provide a dielectric material whose coefficient of expansion is closely matched to a conventional substrate, e.g. alumina, up to about 30 percent by weight of a conventional ceramic filler can be included in the formulation. Inks preferably contain from about 5 to about 15 percent by weight of the filler.

Suitable ceramic fillers include alumina ($Al_2O_3$), barium dimagnesium disilicate ($BaMg_2Si_2O_7$), dimagnesium borate ($Mg_2B_2O_5$), zirconium silicate ($ZrSiO_4$), dimagnesia silicate ($2MgO \cdot SiO_2$), dimagnesia dialumina pentasilicate ($2MgO \cdot 2Al_2O_3 \cdot 5SiO_2$), magnesium aluminate ($MgAl_2O_4$) and mixtures thereof. A preferred filler is a mixture of alumina and barium dimagnesium disilicate in a weight ratio of about 2:1 and more preferably about 4:1 when the devitrifying zinc-magnesium-barium-aluminum-silicate glass frit is employed in a dielectric ink used to form a multilayer structure on an alumina substrate.

In preparing ink formulations, the glass frit and the filler, if present, are reduced to a particle size of from about 1–5 micrometers. The solid particles are combined with an organic vehicle and thoroughly mixed to make the ink. The organic vehicle can be selected to give screen printing characteristics to the inks and to burn off cleanly in nitrogen or air, i.e without leaving a carbonaceous residue.

The organic vehicles are solutions of resin binders such as, for example, cellulose derivatives, particularly ethyl cellulose, synthetic resins such as polyacrylates, polymethacrylates, polyesters, polyolefins and the like in a suitable solvent. A preferred binder poly(isobutylmethacrylate). In general, conventional solvents utilized in inks of the type described herein may be used. Preferred commercially available solvents include, for example, pine oil, terpineol, butyl carbitol acetate, 2,2,4-trimethyl-1,3-pentanediol monoisobutyrate, available from Texas Eastman Company under the trademark Texanol and the like. The vehicles suitably contain from about 5 to about 25 percent by weight of the resin binder. However, it may be necessary to add more solvent to the organic vehicle to adjust the ink rheology. Thus, the organic vehicle may contain from about 2 to about 25 percent by weight of the resin binder. The vehicles also suitably contain from about 0.5 to about 10, preferably from about 1 to about 3, percent by weight of a suitable surfactant such as oleylamine, available as Armeen O or a high molecular weight N-alkyl-1, 3-diaminopropane dioleate, available as Duomeen TDO, both from AKZO Chemie America.

The above resin binders may be utilized individually or in any combination of two or more. A suitable viscosity modifier can be added to the resin material, if desired. Such a modifier can be, for example, a castor oil derivative available from NL Industries under the trademark Thixatrol. Regardless of the vehicle utilized, it is important that the homogeneity of the ink be maximized. Therefore, mixing is suitably carried out in a conventional apparatus which mixes in combination with subjecting the dispersion to high shearing action.

Dielectric inks of this invention can be applied to substrate structures by conventional means, i.e. screen printing, brushing, spraying and the like with screen printing being preferred. Generally, as in conventional in the art, several individually dried and fired layers of dielectric are utilized to minimize the potential for through pin holes. The inks may also be applied to conventional release tape, dried and applied to the substrate as a layer. The layers may also be fired on a release surface, removed and utilized as stand-alone substrates. Other conventional methods of forming stand-alone substrates, such as injection molding, can also be utilized.

The coating of the ink is dried in air at 100°–125° C. for from 10 to 20 minutes and fired in nitrogen at 50 –950° C. for from 5 to 15 minutes to form a dielectric layer comprising from about 65 to 100, preferably from about 4 to about 95, percent by weight of the glass frit and up to about 35, preferably from about 5 to about 26, percent by weight of the ceramic filler.

The inks are advantageous in that, during firing, the glass frit remains porous up to temperatures in excess of 700° C. In comparison to conventional inks containing glass frits that soften and densify at about 600° C., the inks of this invention provide sufficient time in the furnace for the furnace gases to penetrate the frit and remove the last residues of carbonaceous material. Due to the extra time available to remove the carbonaceous residues during firing, it is not necessary to include art-recognized oxygengenerating components such as barium nitrate, nor to subject the dried inks to an oxidizing or reducing plasma as described in the Prabhu et al. U.S. Pat. No. 4,619,836 mentioned above.

In addition to the above-mentioned advantages, the dielectric layers prepared from the inks have good mechanical strength and excellent temperature stability due to the proximity of the glass softening temperature to the firing temperature. It is further advantageous that, due to the absence of significant large modifier ions, dielectric layers formed from the inks are particularly resistant to flux penetration. Large modifier ions, when present, provide sites in the glass structure for similarly sized flux ions, such as bismuth oxide, to modify the glass properties. These materials, after repeated firings and in the presence of reducing agents that may be in the furnace atmosphere, may be converted to the free metal, thus providing the conductivity which will cause the circuit to short. A further deterrent to flux penetration into the dielectric layer of this invention is the refractory nature of the crystalline microstructure thereof which is stable upon repeated firing above 900°

C. Stand-alone substrates formed from the compositions are useful in a wide range of applications in the same manner as conventional alumina circuit boards.

The following Examples illustrate this invention. In the Examples, all parts and percentages are on a weight basis and all temperatures are in degrees Celsius unless otherwise stated.

EXAMPLE 1

Glasses are prepared by weighing the following components, mixing and melting at about 1550° in air in platinum containers. The melts are quenched with dry counter-rotating ferrous metal rollers having a 0.01 inch gap. The coefficient of expansion of each formulation is determined using a fused silica dilatometer. The coefficient of expansion of the glass is given as alpha measured at 900°. The alpha numbers represent a value x 10−7 cm per cm per degree Celsius.

| | Glass Formulation (Percent) | | | | |
|---|---|---|---|---|---|
| Constituent | A | B | C | D | E |
| ZnO | 16.35 | 17.44 | 20.06 | 21.81 | 21.81 |
| MgO | 10.43 | 22.49 | 17.60 | 19.25 | 16.50 |
| BaO | 10.39 | 5.38 | 9.36 | 5.88 | 7.84 |
| $Al_2O_3$ | 16.65 | 8.39 | 9.46 | 9.38 | 10.68 |
| $SiO_2$ | 42.18 | 42.30 | 39.52 | 39.68 | 39.17 |
| $P_2O_5$ | 1.00 | 2.00 | 2.00 | 2.00 | 1.00 |
| $ZrSiO_4$ | 3.00 | 2.00 | 2.00 | 2.00 | 3.00 |
| PbO (approx) | .5 | .5 | .5 | .5 | .5 |
| $Fe_2O_3$ (approx) | .5 | .5 | .5 | .5 | .5 |
| Alpha (900°) | 78.2 | 92.9 | 74.3 | 77.5 | 73.6 |

Inks are prepared comminuting the thin glass ribbons formed by quenching the melts in a ball-mill to achieve a mean particle size of about 5 micrometers. The glass formulations are individually combined with a ceramic filler such as alumina and barium dimagnesium disilicate having an average particle size of about 3 micrometers and an organic vehicle such as a 20 percent solution of poly(isobutylmethacrylate) in Texanol also containing one percent of the surfactant Duomeen TDO. The proportion of the ink are 67.7 percent glass, 5.8 percent alumina, 3.9 percent barium dimagnesium disilicate and 22.6 percent organic vehicle.

The ink ingredients are initially hand-mixed, then mixed on a three-roll mill to make a smooth paste suitable for screen printing. Additional solvent is added as necessary to assure proper rheology. The inks are individually printed onto platinum foil, air-dried at 125°for about 15 minutes, then fired in nitrogen at about 900°for 10 minutes. A second dielectric layer is similarly printed and fired over the first.

EXAMPLE 2

A copper conductor ink is prepared according to Prabhu et al's copending U.S. Pat. Application Serial No. 914,303 entitled "THICK FILM CONDUCTOR INKS", filed Oct. 2, 1986, the disclosure of which is incorporated herein by reference. The ink contains 76.9 parts of copper powder having an average particle size of 3 micrometers and 7.7 parts of a devitrifying glass frit comprising 9.09 percent of zinc oxide, 30.40 percent of calcium oxide, 18.28 percent of aluminum oxide and 42.23 percent of silicon dioxide. The solid ingredients are mixed with 15.4 parts of an organic vehicle consisting of a 6 percent solution of ethyl cellulose in Texanol, additionally containing the wetting agents Hypothiolate 100 and Armeen O in concentrations of 17 percent and 3 percent, respectively, based on the vehicle. The ink is initially hand-mixed and then mixed on a three-roll mill to obtain a paste suitable for screen printing. Additional solvent was added as required to assure proper rheology.

The copper ink is printed onto a conventional alumina board to form a series of isolated parallel lines 375 micrometers wide separated by spaces of equal width. The copper ink is dried in air at 125° for 15 minutes and fired in nitrogen at 900° for 10 minutes. The dielectric inks of Example 1 are printed, dried, and fired.

A copper via-fill ink was prepared as follows: a devitrifying glass frit consisting of: 21.8 percent of zinc oxide; 16.5 percent of magnesium oxide; 7.8 percent of barium oxide; 39.2 percent of silicon dioxide; 10.7 percent of aluminum oxide; 1.0 percent of phosphorus pentoxide; and 3.0 percent of zirconium silicate and a vitreous glass frit consisting of: 51.59 percent of barium oxide; 12.58 percent of calcium oxide; 15.62 percent of boron trioxide; and 20.21 percent of silicon dioxide are separately prepared and reduced to a particle size of about three micrometers. Solid ingredients consisting of 65 percent of copper powder having an average particle size of three micrometers, 14 percent of devitrifying glass frit and 4 percent of the vitreous glass frit are thoroughly mixed by hand.

The solid ingredients are mixed with 17 parts of an organic vehicle consisting of a 20 percent solution of poly(isobutylmethacrylate) in Texanol additionally containing, as wetting agents, 17 percent of Hypothiolate 100 and 3 percent of Armeen O. The ink is initially hand-mixed and then mixed on a three-roll mill to obtain a paste suitable for screen printing. Additional solvent is added as required to assure proper rheology. The via-fill ink is described in copending U.S. Pat. Application Serial No. 914,296 of Prabhu et al., entitled "THICK-FILM COPPER VIAFILL INKS", filed Oct. 2, 1986.

The via-fill ink is printed into the spaces in the dielectric ink, dried in air at 125° for 15 minutes and fired in nitrogen at 900° for 10 minutes. The thickness of the dielectric/copper via-fill is 15 micrometers. The dielectric/copper via-fill depositions are repeated three times to form a final dielectric layer thickness of 45 micrometers. A second layer of the copper conductor ink is deposited and fired over the dielectric so that a portion is in contact with the copper via-fill. The procedure is repeated three times to produce a multilayer copper-based device having four buried copper layers.

The structure is biased through electrical contacts made to the copper layers and studied for evidence of shorting or loss of contact in any of the copper layers.

EXAMPLE 3

Devitrifying glasses of the following composition are prepared and the coefficients of thermal expansion determined using the procedure of Example 1.

| GLASS FORMULATION (PERCENT) | | |
|---|---|---|
| Constituent | F | G |
| ZnO | 22.26 | 18.29 |
| MgO | 19.05 | 22.35 |
| BaO | 6.00 | 11.15 |
| $Al_2O_3$ | 9.56 | 12.05 |
| $SiO_2$ | 40.51 | 36.16 |
| $P_2O_5$ | 1 | 0 |
| $ZrSiO_4$ | 0 | 0 |
| PbO (approx) | .4 | .4 |

-continued

| GLASS FORMULATION (PERCENT) | | |
|---|---|---|
| Constituent | F | G |
| $Fe_2O_3$ (approx) | .6 | .6 |

Dielectric inks employing devitrifying glass frits are prepared using procedures similar to those described in Example 1.

Dielectric inks are printed onto conventional alumina substrates and dried in air at 125° for 15 minutes. The dried ink layers are then fired in nitrogen at 900° for 1-0 minutes.

EXAMPLE 4

Devitrifying glasses of the following composition are prepared and the coefficients of thermal expansion determined using the procedure of Example 1:

| GLASS FORMULATION (PERCENT) | | |
|---|---|---|
| Constituent | H | I |
| ZnO | 22.72 | 24.71 |
| MgO | 20.05 | 20.05 |
| SrO | 4.77 | 7.40 |
| $Al_2O_3$ | 10.39 | 7.96 |
| $SiO_2$ | 42.07 | 39.88 |
| $P_2O_5$ | — | — |
| $ZrSiO_4$ | — | — |
| PbO (approx) | .4 | .4 |
| $Fe_2O_3$ (approx) | .6 | .6 |

Inks containing the devitrifying glass frit are prepared using procedures similar to those described in Example 1. The ink contains 77 percent of solids and 23 percent of the organic vehicle. The solids contain 91.5 percent frit, 1.5 percent barium dimagnesium disilicate, and percent alumina. The organic vehicle is 66.5 percent of 6 weight parts ethyl cellulose in 100 weight parts Texanol, 4.1 percent 10 weight parts Thixatrol in 100 weight parts Texanol, 29.4 percent Texanol and 1.0 percent of Duomeen TDO. This ink is printed onto an alumina substrate and fired using the conditions described in Example 1.

We claim:

1. A devitrifying glass frit comprising, on a weight basis: from about 15 to about 25 percent of zinc oxide, from about 10 to about 25 percent of magnesium oxide, from about 3 to about 12 percent of an oxide selected from the group consisting of barium oxide and strontium oxide, from about 5 to about 20 percent of aluminum oxide, from about 35 to about 50 percent of silicon dioxide, from 0 to about 3 percent of phosphorus pentoxide; from 0 to about 5 percent of zirconium silicate, from 0.01 to about 1 percent lead oxide, and from 0.01 to about 1 percent iron oxide.

2. A devitrifying glass frit according to claim 1 comprising barium oxide, from b 0 to about 1.0 percent of phosphorus pentoxide, and from 0 to about 1 percent of zirconium silicate.

3. A glass frit according to claim 1, comprising from about 17 to about 23.5 percent of zinc oxide; from about 17 to about 23.5 percent of magnesium oxide; from about 5 to about 10 percent of barium oxide; from about 8 to about 11 percent of aluminum oxide; and from about 39 to about 43 percent of silicon dioxide.

4. A devitrifying glass frit according to claim 1 comprising from about 17 to about 23.5 percent of zinc oxide; from about 17 to about 23.5 percent of magnesium oxide; from about 3 to about 10 percent of strontium oxide; from about 7 to about 11 percent of aluminum oxide; from about 38 to about 43 percent of silicon dioxide; from 0 to about 2 percent of phosphorus pentoxide; and from 0 to about 2 percent of zirconium silicate.

5. A devitrifying glass composition according to claim 1 comprising about 22.3 weight percent zinc oxide, about 19.7 weight percent magnesium oxide, about 6 weight percent barium oxide, about 40.5 weight percent silica, about 9.6 weight percent alumina, about 1 weight percent phosphorous pentoxide, about 0.4 weight percent lead oxide and about 0.6 weight percent iron oxide.

6. A dielectric composition for multilayer integrated circuit fabrication comprising:
   a) from about 50 to about 75 percent by weight of a devitrifying glass frit comprising, on a weight basis: from about 15 to about 25 percent zinc oxide; from about 10 to about 25 percent magnesium oxide, from about 3 to about 12 percent of an oxide selected from the group consisting of barium oxide and strontium oxide, from about 5 to about 20 percent aluminum oxide, from about 35 to about 50 percent silicon dioxide, from 0 to about 3 percent phosphorus pentoxide, from 0 to about 5 percent zirconium silicate, from about 0.01 to about 1 percent iron oxide, and from about 0.01 to about 1 weight percent lead oxide;
   b) up to about 30 percent by weight of a suitable ceramic filler; and
   c) from about 15 to about 30 percent by weight of a suitable organic vehicle.

7. A dielectric ink according to claim 6 comprising barium oxide, from 0 to about 1 percent phosphorus pentoxide, and from 0 to about 1 percent zirconium silicate.

8. A dielectric ink according to claim 6 comprising from about 17 to about 23.5 percent zinc oxide, from about 17 to about 23.5 percent magnesium oxide, from about 5 to about 10 percent barium oxide, from about 8 to about 11 percent aluminum oxide, and from about 39 to about 43 percent silicon dioxide.

9. A dielectric ink in accordance with claim 6 wherein the glass frit comprises, on a weight basis: from about 17 to about 23.5 percent of zinc oxide; from about 17 to about 23.5 percent of magnesium oxide; from about 3 to about 10 percent of strontium oxide; from about 7 to about 11 percent of aluminum oxide; from about 38 to about 43 percent of silicon dioxide; from 0 to about 2 percent of phosphorus pentoxide and from 0 to about 2 percent of zirconium silicate.

10. A dielectric ink in accordance with claim 6 wherein the ink contains from about 5 to about 15 percent by weight of the filler.

11. A dielectric ink in accordance with claim 10 wherein the filler is selected from the group consisting of alumina, barium dimagnesium disilicate, dimagnesium borate, zirconium silicate, dimagnesia silicate, dimagnesia dialumina pentasilicate, magnesium aluminate and mixtures thereof.

12. A dielectric ink in accordance with claim 11 wherein the filler material is a mixture of alumina and barium dimagnesium disilicate.

13. In a multilayer, integrated circuit structure comprising a suitable substrate having thereon at least two patterned layers of a conductor, said layers being separated by a dielectric layer having vias therein, the vias being filled with a conductor to contact said conductor layers, the improvement wherein said dielectric layer comprises:

a) from about 65 to 100 percent by weight of a devitrifying glass comprising, on a weight basis: from about 15 to about 25 percent zinc oxide, from about 10 to about 25 percent magnesium oxide, from about 3 to about 12 percent of an oxide selected from the group consisting of barium oxide and strontium oxide, from about 5 to about 20 percent aluminum oxide, from about 35 to about 50 percent silicon dioxide, from 0 to about 3 percent phosphorus pentoxide, from 0 to about 5 percent of zirconium silicate, and from 0.01 to about 1 percent lead oxide, and from 0.01 to about b 1 percent iron oxide; and b) up to about 35 percent by weight of a suitable ceramic filler.

14. A circuit structure in accordance with claim 13, wherein the devitrifying glass consists essentially of, on a weight basis: from about 17 to about 23.5 percent zinc oxide, from about 17 to about 23.5 percent magnesium oxide, from about 5 to about 10 percent barium oxide, from about 8 to about 11 percent aluminum oxide, and from about 398 to about 43 percent silicon dioxide.

15. A circuit structure in accordance with claim 13 wherein the devitrifying glass comprises, on a weight basis: from about 17 to about 23.5 percent zinc oxide, from about 17 to about 23.5 percent magnesium oxide, from about 3 to about 10 percent strontium oxide, from about 7 to about 11 percent aluminum oxide, from about 38 to about 43 percent silicon dioxide, from 0 to about 2 percent zirconium silicate.

16. A circuit structure in accordance with claim 13 wherein the dielectric layer contains from about 5 to about 26 percent by weight of the filler.

17. A circuit structure in accordance with claim 13 wherein said conductor is copper.

* * * * *